United States Patent [19]
Ying et al.

[11] Patent Number: 5,900,644
[45] Date of Patent: May 4, 1999

[54] TEST SITE AND A METHOD OF MONITORING VIA ETCH DEPTHS FOR SEMICONDUCTOR DEVICES

[75] Inventors: Shu-Lan Ying; Yuan-Chang Huang, both of Hsin-chu; Jue-Jye Chen, I-Lan; Yuh-Jier Mii, Taipei, all of Taiwan

[73] Assignee: Taiwan Semiconductor Manufacturing Company, Ltd., Hsin-Chu, Taiwan

[21] Appl. No.: 08/892,214

[22] Filed: Jul. 14, 1997

[51] Int. Cl.⁶ .................................................. H01L 23/58
[52] U.S. Cl. ................................. 257/48; 438/17
[58] Field of Search ................................ 257/48; 438/16, 438/17

[56] References Cited

U.S. PATENT DOCUMENTS

| | | | |
|---|---|---|---|
| 5,229,309 | 7/1993 | Kato | 437/43 |
| 5,451,529 | 9/1995 | Hsu et al. | 437/8 |
| 5,494,697 | 2/1996 | Blayo et al. | 427/10 |
| 5,780,870 | 7/1998 | Maeda et al. | 257/48 |

Primary Examiner—Olik Chaudhuri
Assistant Examiner—Douglas A. Wille
Attorney, Agent, or Firm—George O. Saile; Stephen B. Ackerman; William J. Stoffel

[57] ABSTRACT

The present invention provides a test site on a product wafer for measuring via etch depth and a method of monitoring the depth of the vias using the test site. A substrate is provided having a test site area and a circuit area. A test site via is formed in the test site area. The test site via is used in measuring the depth of the insulating layers remaining in a test site via and the depth of the test site via. The measurements are taking using an in-line non-destructible measurement tool, such as an ellipsometer or spectrophotometer. The test site is specially designed to be large enough to have the via depth measured by an in-line measuring tool. The depth of the oxide remaining in the test site via is measured after the via etch and is correlated to the amount of titanium nitride removed from the tops of the metal lines in the circuit areas. The via etch process is then adjusted to center the via etch at the optimum point to ensure that enough the vias are deep enough without removing too much of the top barrier layer (e.g., titanium nitride) film over the metal lines.

18 Claims, 4 Drawing Sheets

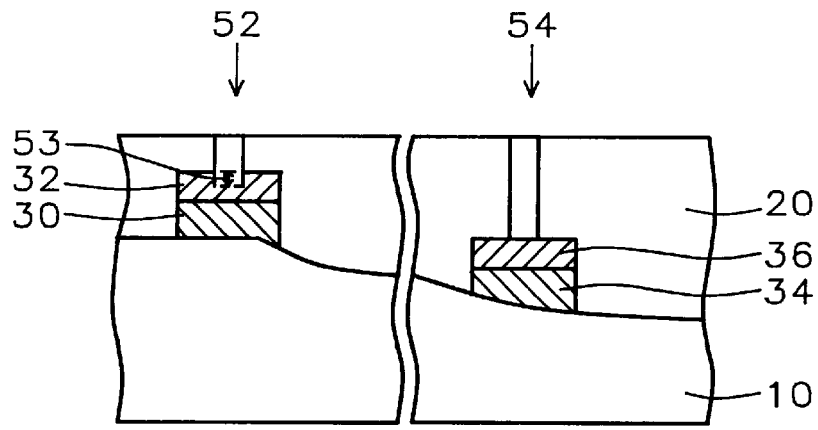
FIG. 1 - Prior Art
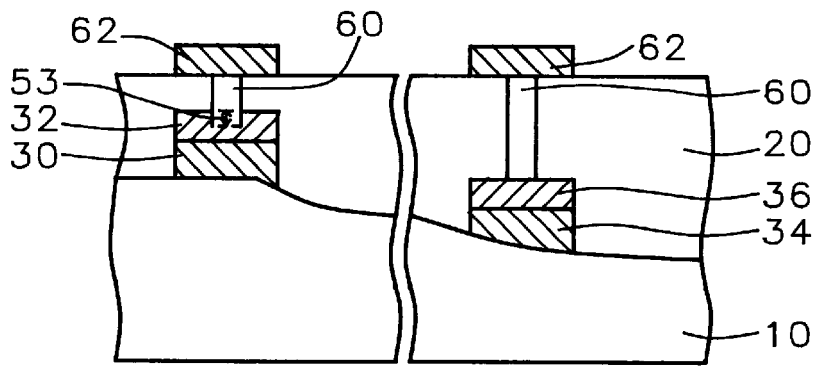
FIG. 2 - Prior Art
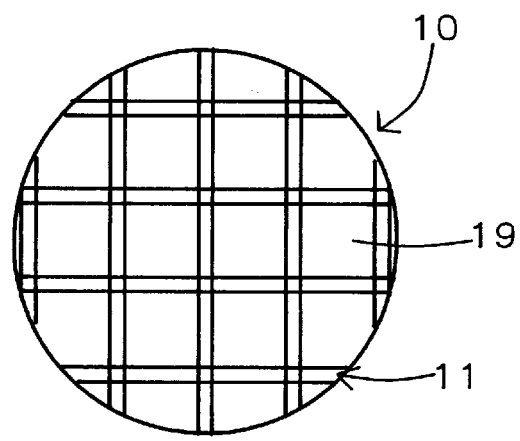
FIG. 3

Titanium Nitride (32) Remaining Over The Metal Layer (30)

TEST SITE AND A METHOD OF MONITORING VIA ETCH DEPTHS FOR SEMICONDUCTOR DEVICES

BACKGROUND OF INVENTION

1) Field of the Invention

This invention relates generally to fabrication of semiconductor devices and particularly to a device and a method of measuring via etch depth and more particularly to a test site and method of monitoring the oxide loss during via etch of overlying metal lines.

2) Description of the Prior Art

Semiconductor technologies have dramatically increased the circuit density upon a chip. The miniaturized devices built in and on a semiconductor substrate are very closely spaced and their packing density has increased significantly. The more recent advances in photolithographic technique, such as phase shifting masks, and self aligning process steps have ever reduced the device size and increased circuit density. This has lead to ultra large scale integration with minimum device dimensions less than a micron and more than a million transistors on a chip. To continue this trend, one challenge facing manufacturers is forming the vias (e.g., holes) through insulating with less etching or damaging the underlying metal lines.

As shown in FIGS. 1 and 2, a conventional semiconductor device is fabricated as follows: semiconductor structures, such as the sources, drains, and gate electrodes, capacitors, insulation layers, etc. are formed in and on a semiconductor substrate 10. Next, a first level metal layer 30 34 is formed over the substrate 10. The first level metal 30 34 often has a top barrier layer 32 36 formed of titanium nitride. The titanium nitrate (TiN) layer 32 36 acts as a barrier to prevent the source gases (e.g., $WF_6$) form the subsequent tungsten layer from reacting with the first metal layer 30 34 (e.g., aluminum). Without the barrier layer 30 34, an undesired high resistance layer (e.g., $AlF_3$) could form on the first metal layer and increase the Rc-Via (resistance of the via) and cause Cp yield losses. See FIG. 2.

As shown in FIG. 1, an inter metal dielectric layer 20 is formed over the first metal layer 30 34 and the barrier layer. The inter metal dielectric layer 20 is then planarized to m create a flat level top surface. As shown in FIG. 1, often the underlying topology makes the metal layers 30 34 have different heights and also varies the thickness of the inter metal dielectric layer 20 over the various lines 30 34. As shown for example in FIG. 1, the metal layer 30 is higher than the nearby second metal layer 34.

Next, via's 52 54 are then etched through the inter metal dielectric layer 20 to expose the first level metal 30 32 34 36. The via 52 is shallower than via 54 because the inter metal dielectric layer 20 is thinner over shallow via area 52.

Problems occur where the inter metal dielectric layer has varying thicknesses across the wafer. The metal layers have different underlying structures which cause the inter metal level dielectric layer to be thicker or thinner over a particular metal landing.

This via depth difference or inter metal dielectric thickness difference between product metal lines causes problems. For example, as shown in FIG. 1, in the shallow via 52, the via etch removes a thickness 53 of the TiN layer overlying the first metal 30. If the thickness of TiN barrier layer removed becomes too much, the resistance of the interconnect increases. If the TiN layer is etched through and the metal line is exposed, the interconnect resistance increases significantly. The increased interconnect resistance causes circuit performance problems and Cp yield losses.

Referring to FIG. 2, an interconnect 60 is formed in the via 52 54 and then a second metal layer 62 is formed over the interconnect 60. If the via etch breaks through the titanium nitride layers 32 36, the resistance of the interconnect increases abruptly. Increasing the thickness of the titanium nitride layer could reduce the via overetch problem but this lowers process throughput and creates step coverage problems.

Other practitioners in the art have work on other semiconductor problems. U.S. Pat. No. 5,494,697 (Blayo) shows a thickness monitoring with an ellipsometer. U.S. Pat. No. 5,229,309 (Cheng) and U.S. Pat. No. 5,451,529 (Hsu) show other monitoring methods. However, these patents do not adequately solve the problem of preventing via over etch. Therefore there is a need to develop a method and a device to easily measure the via etch so that the via etch process can be more easily controlled.

SUMMARY OF THE INVENTION

It is an object of the present invention to provide a test site device and a method for monitoring the depth of the via etch in a process of fabricating semiconductor devices.

It is an object of the present invention to provide a device and method for measuring/predicting/correlating the etching of a titanium nitride film over metal lines during a via etch using a test site via monitor formed on the substrate.

It is another object of the present invention to provide a device and method for measuring the via etch depth on a test site on a product wafer that can be measured in-line, non-destructively, and automatically.

To accomplish the above objectives, the present invention provides a test site on a product wafer for measuring via depth and a method of monitoring the depth of the vias using the test site. A substrate is provide having a test site area and a circuit area. The test site area receives the same process treatments, except for polycide gate and metal lines, as the circuit areas. A test site via is formed in the test site area. The test site via is used in measuring the depth of the insulating layers remaining in a test site via and the depth of the test site via. The measurement are taking using an in-line non-destructible measurement tool, such as an ellipsometer or spectrophotometer. The test site is specially designed to be large enough to have the via depth measured by a measuring tool and the test site via does not expose any underlying metal lines. The depth of the oxide remaining in the test site via is measured after the via etch and is correlated to the amount of titanium nitride removal from the tops of the metal lines in the circuit areas. The via etch process is then adjusted to center the via etch at the optimum point to ensure that enough the vias are deep enough without removing too much titanium nitride film over the metal lines.

In slightly more detail the method of the invention for monitoring via depth in a substrate by forming a test site via and measuring the depth of the test site via, comprises a) providing a semiconductor substrate having at least a test site area and a circuit area; the circuit area having a shallow via area and a deep via area;

b) forming field oxide regions in the test site area and the circuit area;

c) forming a polycide layer over portions of the field oxide regions in at least the shallow via area;

d) forming an inter level dielectric (ILD) layer over the resultant surface;

e) forming first metal lines over the interlevel dielectric layer in the shallow via area and in the deep via area;

f) forming a top barrier layer composed of titanium nitride over the first metal lines;

g) forming an inter metal dielectric (IMD) layer over the resultant surface;

h) forming a via photoresist layer over the inter metal dielectric layer, the via photoresist layer having openings over the circuit area and the test site area;

i) etching portions the inter metal dielectric layer and the top barrier layer using the via photoresist layer as a mask, forming at least a test site via in the test site area, forming a shallow via in the shallow via area, and forming a deep via in the deep via area;

j) measuring and correlating the depth of the test site via 50 to the thickness of the top barrier layer in the circuit area removed by the etching in step (i).

The etching of the circuit vias removes a portion of the top barrier layer over the metal lines, the etching performed by a via etch process. The measured thicknesses of the field oxide region, the interlevel dielectric layer and the intermetal dielectric layer under the test site via is correlated to the remaining thickness of the top barrier layer over the metal lines. The via etch process is then adjusted to minimize the amount of top barrier layer removed in a subsequent via etch of a subsequent wafer.

The test site via of the present invention comprises: a substrate having a test site area and a circuit area; field oxide regions over portions of the test site area and circuit area; an inter level dielectric layer over the field oxide regions and the substrate; an inter metal dielectric layer over the inter level dielectric layer; and a test site via extending through portions of the inter metal dielectric layer in the test site area; the test site via having an area; and circuit vias extending through portions of the inter metal dielectric layer in the circuits areas.

The via test site and method of the present invention have many advantages over the prior arts. The invention provides a very practical and manufacturable method of controlling via etch stop, especially on a titanium nitride barrier layer over a metal line. The invention is very suitable for use in products with dark scribe lines and dark pads via-patterned products where the scribe lines cannot be used to monitor process thickness.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 and 2 show cross section views of a substrate having the via overetch problem of the prior art.

FIG. 3 is a top down view of a substrate of the present invention showing the circuit areas and the test site areas.

DETAILED DESCRIPTION OF THE PREFERRED EMBODIMENTS

Figure 4:
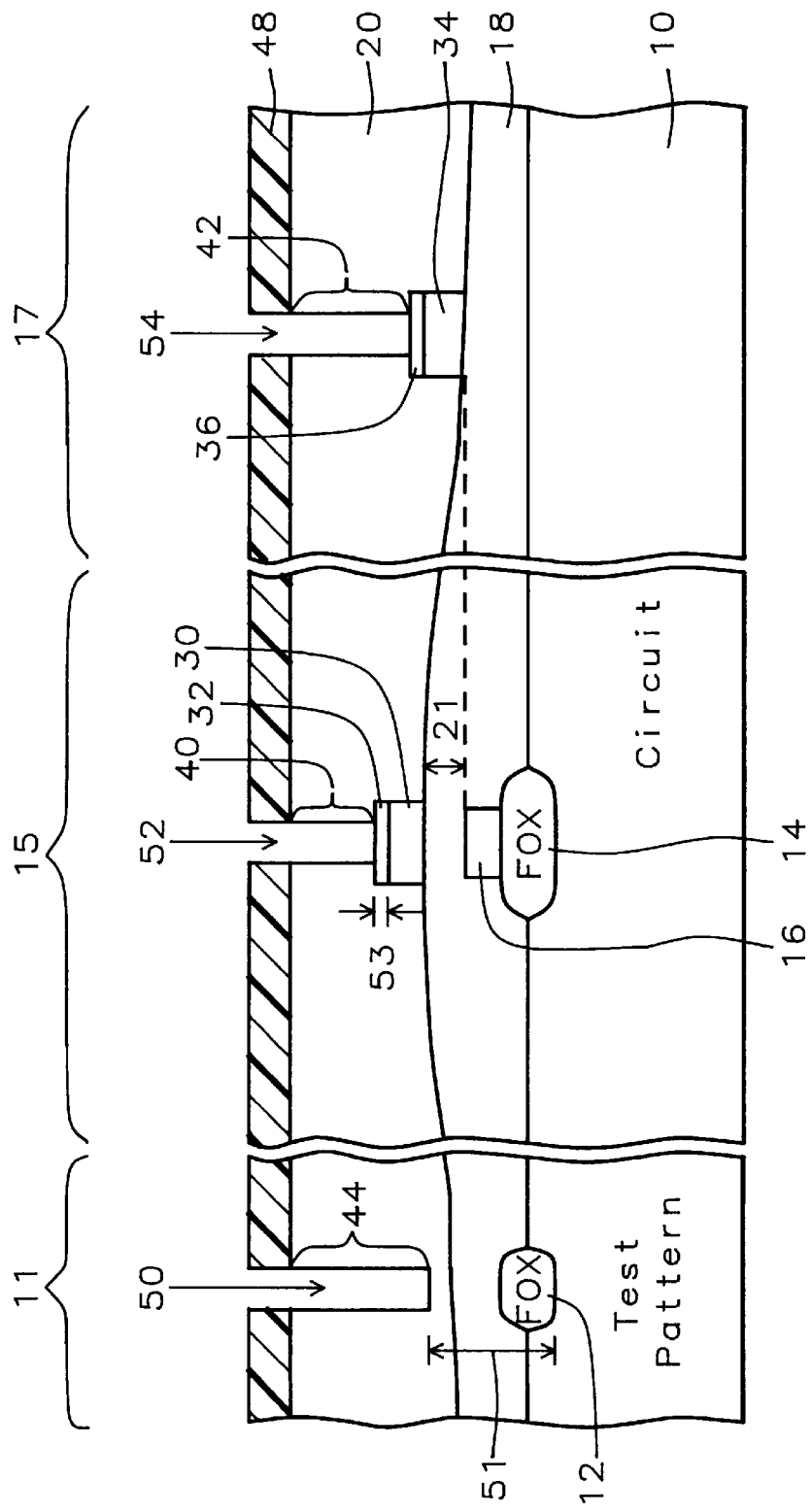
FIG. 4 is a cross sectional view for illustrating the test site and method for manufacturing the test site according to the present invention.

The present invention will be described in detail with reference to the accompanying drawings. The present invention provides a device (e.g., test site 11) and a method of forming the test site and monitoring via depth using the test site. The test site 11 is formed on the same wafer as the product devices (in circuit areas). The product devices are formed in circuit areas on the wafer. The test site undergoes the same processing as the circuit areas (e.g., product chips) except for the polycide gate and metal lines. The test site is masked or exposed to form the test site structure desired as explained below. This description is only an example of numerous variations of the test site 11 and circuit areas 15 17 19 possible which are obvious to those skilled in the art. The processes the circuit areas 15 17 19 undergo is not described in detail below as it depends upon the particular device being formed.

As shown in FIG. 3, the method begins by providing a semiconductor substrate 10 having a test site area 11 and a circuit area 15 17 19. The areas between the circuit areas (chips) 15 17 are preferably used to form the test site 11 of the present invention.

Substrate 10 is understood to possibly include a semiconductor wafer, active and passive semiconductor devices/ elements formed within the wafer and layers formed on the wafer surface. The term "substrate" is mean to include devices formed within a semiconductor wafer and the layers overlying the wafer. The term "substrate surface" is meant to include the upper most exposed layers on a semiconductor wafer, such as a silicon surface, an insulating layer and metallurgy lines.

FIG. 4 shows a cross sectional view of the substrate illustrating the test site areas 11 and circuit areas 15 17 (i.e., 19). The circuit area 15 17 has at least two areas for illustration purposes: a shallow via area 15 and a deep via area 17. These areas 15 17 are examples of only two possible areas on a semiconductor chip where vias are formed. Various semiconductor elements are formed in these areas, such as source, drains, gate electrodes, resistors, capacitors, conductive lines, etc. Shallow via area will have a thin insulating layer (or inter metal dielectric layer 20) the via 52 will etch through, hence the name "shallow via area" 15. Likewise the deep via area 17 will have a deep via 54. The metal line 30 in the shallow via area 15 is higher than the adjacent line 36 because the underlying topology makes the metal line 30 higher. For example in a typical circuit can have height difference 21 between about 0.7 to 1.4 $\mu$m (or more) between metal layer heights Next, field oxide regions 12 14 are formed in the test site area 11 and the circuit area 15 17. The relatively thick field oxide (FOX) 12 14 is formed around the active device areas to electrically isolate these areas. This field oxide preferably is formed by masking the active device areas with a thick silicon oxide (pad oxide) and a thicker silicon nitride layer which forms an oxidation barrier. The silicon substrate is then oxidized in an oxidizing ambient to form the field oxide. The preferred final thickness of the field oxide being in the range of about 3000 to 5000 Å and more preferably about 3600 Å. One method of forming these field oxide regions is describe by E. Kooi in U.S. Pat. No. 3,970,486, wherein selected surface portions of a silicon substrate are masked against oxidation and the unmasked surface is oxidized to grow a thermal oxide which in effect sinks into the silicon surface at the unmasked areas. The mask is removed and semiconductor devices can be formed in the openings between the isolation regions.

A polycide layer 16 is preferably formed over portions of the field oxide regions 14 in at least the shallow via area 15. The polycide layer 16 is preferably formed of a polysilicon layer and Tungsten silicide ($WSi_x$) or Titanium silicide (TiSix) layer. More preferably $WSi_x$ is used to form the top layer. The polycide layer 16 preferably has an overall thickness in the range of between about 2500 and 5000 Å and more preferably about 3750 Å. For example the polysilicon layer is preferably 2500 Å thick and the $WSi_x$ layer is preferably 1250 Å thick. The polycide layer can be used to form gate electrodes in the circuit areas. The polycide layer is just an example of the semiconductor structures underlying the metal lines which can affect the topology, e.g., gate electrodes, word lines, capacitors, etc.

An inter level dielectric (ILD) layer 18 is then formed over the resultant surface as shown in FIG. 1. The interlevel dielectric layer 20 is preferably formed of a material such as $O_3$-TEOS (Tetraethylorthosilicate), phosphosilicate glass (PSG) or Plasma enhanced (PE) $SiH_4$ oxide and more preferably formed of $O_3$-TEOS. The interlevel dielectric layer 18 preferably has a thickness in the range-of between about 6000 and 10000 Å and more preferably about 8000 Å.

Then, first metal lines 30 are formed over the interlevel dielectric layer 18 in the shallow via area 15 and in the deep via area 17 (and in other circuit areas on the substrate). The first metal lines 30 are preferably formed of an aluminum/Copper (Al/Cu) or Al/Cu/Si and more preferably formed of Al/Cu. The first metal lines 30 preferably have a thickness in the range of between about 2000 and 6000 Å and more preferably about 4000 Å.

Next, a top barrier layer (e.g., a titanium nitride (TiN) film) 32 is formed over the first metal lines 30. The top barrier layer can be composed of any material which will prevent a the source gas (e.g., $WF_6$) of the subsequent tungsten via fill layer from reacting directly with the metal layer (e.g., Al). The top barrier layer also can increase the adhesion of the tungsten layer to the metal lines as well as lower the contact resistance. The top barrier layer can be formed of titanium nitride (TiN), titanium (Ti), Ti/TiN, titanium tungsten (TiW) and is more preferably formed of titanium nitride (TiN). The titanium nitride layer 32 preferably has a thickness in the range of between about 250 and 1400 Å and more preferably about 1000 Å.

Preferably an anti-reflecting-coating (ARC) TiN layer 32 36 is formed over the metal lines. The anti-reflective properties improve lithography resolution by reducing reflectance off the layer. The ARC TiN layer can be formed by a sputtering process by reacting an excess of $N_2$ with Ti metal target. The layer 36 preferably has a reflectivity in a range between 0.5 and 0.6 and more preferably about 0.55.

Subsequently, an inter metal dielectric (IMD) layer 20 over the resultant surface. The inter metal dielectric layer 20 is preferably formed of a material selected from the group consisting of: PE oxide, SACVD and spin-on-glass (SOG). The inter metal dielectric layer preferably has a thickness in the range of between about 8000 and 12,000 Å and more preferably about 10,000 Å.

The inter metal dielectric layer is preferably planarized to provide a planar top surface. Layer 20 is preferably planarized by a conventional chemically mechanically polish process or an etch back process.

Preferably, in the test site area 11, the overall thickness of the field oxide 12, the interlevel dielectric layer 20, the inter metal dielectric layer 20 is in the range of between about 19,000 and 24,000 Å and more preferably about 21,000 Å. Also, preferably no metals (or polycides) are formed under the test site via 50. This is so that the test site via etch will not be stopped by the metal layers.

A via photoresist layer 48 is formed over the inter metal dielectric layer 20. The via photoresist layer 48 has openings over the circuit area 15 17 and the test site area 11 where via will be formed in the underlying insulating layers 20 18.

The inter metal dielectric layer 20 (and possibly other underlying layers) is then etched using the via photoresist layer 48 as a mask. The etch forms, for example, at least a test site via 50 in the test site area 11, forms a shallow via 52 in the shallow via area, and forms a deep via 54 in the deep via area 17.

The test site via 50 has preferably a depth in the range of between about 10,000 and 22,000 Å and a length and width in the range of between about 60 and 100 μm and a length and width more preferably about 80 μm. The test site must have an area large enough so that the insulating layer thick in the test site via can be measured using standard non-destructible measurement tools, such as an ellipsometer or a spectrophotometer. The test site via 50 preferably has an area in the range of between about 3600 and 10,000 $μm^2$ and more preferably about 6400 $μm^2$(80 by 80 μm ). The circuit vias 52 54 are typically much smaller. For example a typical product device circuit via 52 54 can have a length and width of 0.6 by 0.6 μm. The test site via is preferably only formed through insulating layers composed at least in part of silicon oxide and is not formed through any metal layers.

Figure 5:
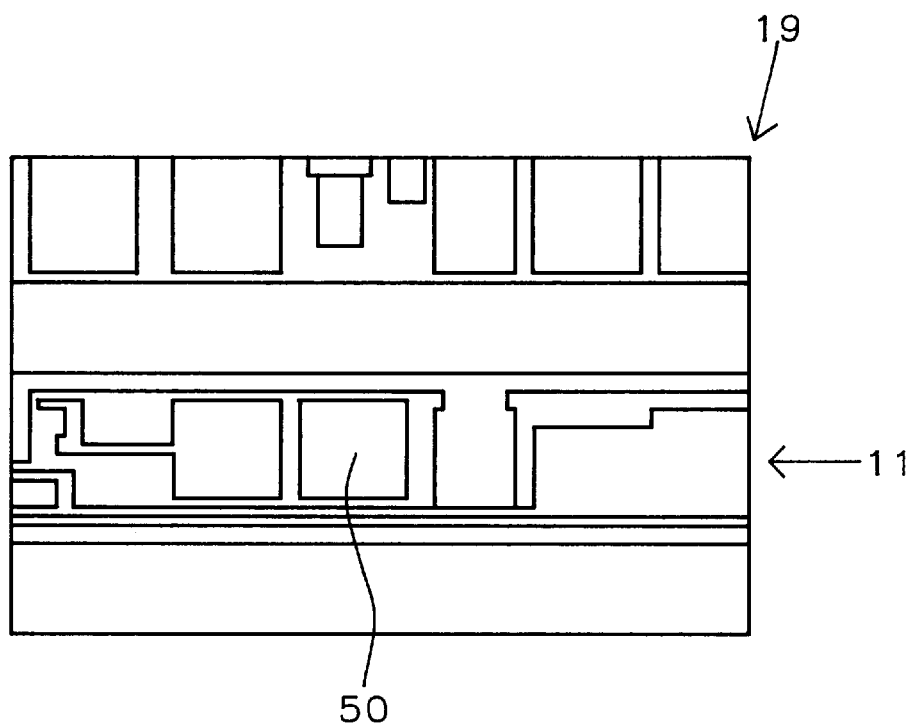
FIG. 5 is a top plan view of the test site 50 of the present invention.

FIG. 5 shows an example of a test site via 50 in a test site area 11 adjacent to a circuit area. The test site 11 is often formed in the area (e.g., the kerf) between the circuit areas (e.g., product chips) on the substrate. (Also see FIG. 3).

The test site window (via) is small enough so that it doesn't impact on the exposure area ratio of the via pattern and or cause problems with the following film deposition or etching. The window is large enough for the film measurement apparatus, so that auto-measurements are feasible.

The shallow via etch removes a thickness of the titanium nitride film 32 over the metal line 30 in the range of between about 500 and 1000 Å and more preferably about 700 Å.

Next, the depth of the test site via 50 is measured and correlated to the removal of the titanium nitride film in the circuit. The shallow via etch removes a portion of the titanium nitride film 32 over the metal lines 30 which must be monitored to ensure that the metal lines are not over etched. From the correlation, we can make appropriate via etch process adjustments to ensure that the titanium nitride removal is at an acceptable level for the next production via etch runs.

Figure 6:
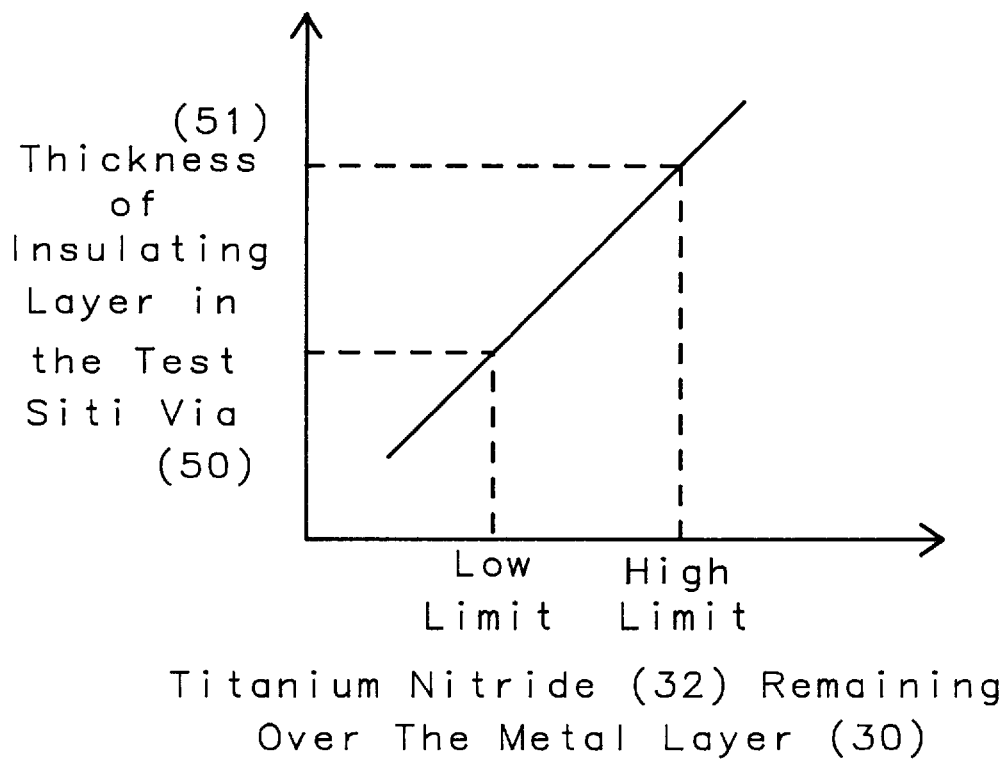
FIGS. 6 and 7 are charts showing examples of the correlation of the remaining oxide left in the test site via to the amount of top barrier layer (e.g., titanium nitride) removed from the metal lines in the product circuit areas by the via etch according to the present invention.
Figure 7:
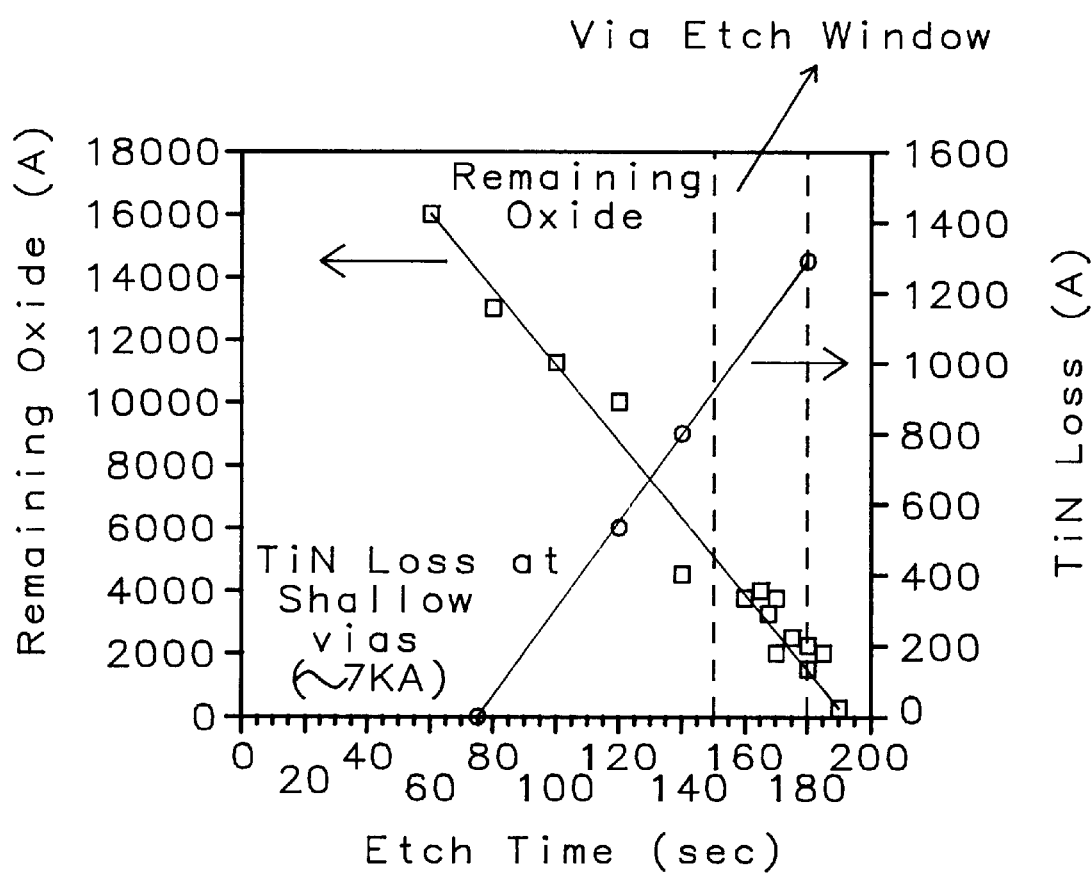

The test site allows the measurement of the thickness 51 (FIG. 4) of the remaining insulating layers 20 18 12 (e.g., oxide). The depth of the test site via can be determined by measuring the overall thickness of the layers 12 18 20 and subtracting the remaining thickness in the via 52. In practice the overall layer thickness is not measured and is assumed to be fairly constant. However, the overall layer (oxide) thicknesses can be measured with an ellipsometer. As shown in FIG. 6, the remaining insulating layer thickness 51 can be correlated against the amount of TiN 30 removed in the via etch. Lower and upper limits can be established for both the titanium nitride removed and the thickness of the insulating layer 51 left in the test site via. FIG. 7 shows another way to correlate the information (from an actual implementation of the invention). The conditions for FIG. 7 were as follows: An etch rate ~6540/min on the test site; control region etch time 150–180 sec; oxide etched 16,350 to 19620Å and oxide left ~4650 to 1380. For example, for 10,000 Å of ocide remains, the TiN lost 900 Å.

Correlating the remaining oxide thickness 51 with the TiN loss 53 can effectively predict when the TiN layer is etched through (broken through) and hence can accurately predict the resistance values (Rc_via) of the interconnects.

Prior to the test site of the present invention, via depths had to be measured with an off line scanning electron microscope (SEM) with focus ion beam (FIB) analysis. These tests were destructive and time consuming. The R_via increases with thinner TiN layer, but the R_via increases abruptly when the TiN layer is etched through.

Using the test site and method it is very easy to determine if the TiN under the shallow via hole is broken (etch) through without using destructive techniques. Also the process can predict the via resistance (Rc_via) thereby by eliminating the wait for the final electrical data. This can save money by allowing the via process to be adjusted sooner which increase yields and throughput.

As shown in FIG. 4, the test site via monitor of the present invention comprises: a substrate having a test site area 11 and a circuit area 15 17; field oxide regions 12 14 over portions of the test site area 11 and circuit area 15 17; an inter level dielectric layer 20; over the resulting surface; an inter metal dielectric layer 20 over the inter level dielectric layer 20; and a test site via 50 through portions of the inter metal dielectric layer 20 in the test site area 11; the test site via having an area large enough that the depth of the test site via can be measured; and circuit vias 52 54 in the circuits areas 15 17.

It should be well understood by one skilled in the art that by including additional process steps not described in this embodiment, other types of devices can also be included in the circuit area. For example, P wells in the P substrate and CMOS circuit can be formed therefrom. Also, additional semiconductor structures/elements, such as gates, drains, sources, capacitors, can be formed underlying the metal lines. It should also be understood that the figures depict only two circuit area vias out of a multitude of vias that are fabricated simultaneously on the substrate.

While the invention has been particularly shown and described with reference to the preferred embodiments thereof, it will be understood by those skilled in the art that various changes in form and details may be made without departing from the spirit and scope of the invention.

What is claimed is:

1. A test site via on a semiconductor substrate comprising:
   a) a substrate having a test site area and a circuit area;
   b) field oxide regions over portions of the test site area and circuit area;
   c) an inter level dielectric layer over said field oxide regions and said substrate;
   d) an inter metal dielectric layer over said inter level dielectric layer; first metal lines on said interlevel dielectric layer in said circuit area; and
   e) a test site via extending through portions of the inter metal dielectric layer in said test site area; said test site via having an area; and
   f) circuit vias extending through portions of the inter metal dielectric layer in said circuits areas.

2. The test site via of claim 1 wherein said field oxide regions have a final thickness of between about 3000 and 5000 Å.

3. The test site via of claim 1 which further includes a polycide layer on said field oxide layer in said circuit area and said polycide layer is formed of a layer of polysilicon and a layer of tungsten silicide and said polycide layer has a thickness of between about 2500 and 5000 Å.

4. The test site via of claim 1 wherein said interlevel dielectric layer is formed of a material selected from the group consisting of: 03-TEOS, PSG and PE oxide, and has a thickness of between about 2500 and 5000 Å.

5. The test site via of claim 1 wherein said first metal lines are formed of a material selected from the group consisting of: aluminum/cooper and aluminum/cooper/silicon, and have a thickness of between about 2000 and 6000 Å.

6. The test site via of claim 5 wherein said first metal lines further include a top barrier layer of composed of titanium nitride and said top barrier layer has a thickness of between about 250 and 1400 Å.

7. The test site via of claim 1 wherein said inter metal dielectric layer is formed of a material selected from the group consisting of PE oxide, SACVD and SOG, and has a thickness of between about 8000 and 12,000 Å.

8. The test site via of claim 1 wherein said test site via has a depth of between about 10,000 and 20,000 Å and a length and width of between about 60 and 100 μm.

9. The test site via of claim 1 wherein said test side via has an area of between about 3600 and 10,000 μm².

10. A test site via on a semiconductor substrate comprising:
    a) a substrate having a test site area and a circuit area;
    b) field oxide regions over portions of the test site area and circuit area;
    c) an inter level dielectric layer over said field oxide regions and said substrate;
    d) an inter metal dielectric layer over said inter level dielectric layer; first metal lines on said interlevel dielectric layer in said circuit area; said first metal lines further include a top barrier layer composed of titanium nitride; and
    e) a test site via extending through portions of the inter metal dielectric layer in said test site area; said test site via having an area; and
    f) circuit vias extending through portions of the inter metal dielectric layer in said circuits areas.

11. The test site via of claim 10 wherein said first metal lines are formed of a material selected from the group consisting of aluminum/cooper and aluminum/cooper/silicon, and have a thickness of between about 2000 and 6000 Å.

12. The test site via of claim 10 wherein said top barrier layer has a thickness of between about 250 and 1400 Å.

13. The test site via of claim 10 wherein said test site via has a depth of between about 10,000 and 20,000 Å and a length and width of between about 60 and 100 μm.

14. The test site via of claim 10 wherein said test side via has an area of between about 3600 and 10,000 μm².

15. A test site via on a semiconductor substrate comprising:
    a) a substrate having a test site area and a circuit area;
    b) field oxide regions over portions of the test site area and circuit area;

c) an inter level dielectric layer over said field oxide regions and said substrate;

d) an inter metal dielectric layer over said inter level dielectric layer; first metal lines on said interlevel dielectric layer in said circuit area and said first metal lines are formed of a material selected from the group consisting of: aluminum/cooper and aluminum/cooper/silicon, and have a thickness of between about 2000 and 6000 Å;

e) a test site via extending through portions of the inter metal dielectric layer in said test site area; said test site via having an area; and f) circuit vias extending through portions of the inter metal dielectric layer in said circuits areas.

16. The test site via of claim 15 wherein said first metal lines further include a top barrier layer of composed of titanium nitride and said top barrier layer has a thickness of between about 250 and 1400 Å.

17. The test site via of claim 15 wherein said test site via has a depth of between about 10,000 and 20,000 Å and a length and width of between about 60 and 100 $\mu$m.

18. The test site via of claim 15 wherein said test side via has an area of between about 3600 and 10,000 $\mu m^2$.

* * * * *